United States Patent [19]

Koike

[11] Patent Number: 4,577,124
[45] Date of Patent: Mar. 18, 1986

[54] CMOS LOGIC CIRCUIT

[75] Inventor: Hideharu Koike, Yokohama, Japan

[73] Assignee: Kabushiki Kaisha Toshiba, Japan

[21] Appl. No.: 621,085

[22] Filed: Jun. 15, 1984

[30] Foreign Application Priority Data

Jul. 28, 1983 [JP] Japan .................................. 58-138319

[51] Int. Cl.[4] ................. H03K 19/017; H03K 19/094; H03K 19/20
[52] U.S. Cl. ..................................... 307/451; 307/448; 307/584; 307/585; 307/605; 307/243
[58] Field of Search ............... 307/443, 440, 445, 448, 307/451, 243, 584, 585, 605

[56] References Cited

U.S. PATENT DOCUMENTS 4,091,293  5/1978  Ando ............................. 307/451 X
4,390,988  6/1983  Best et al. ....................... 307/243 X

FOREIGN PATENT DOCUMENTS 0094234  11/1983  European Pat. Off. ............ 307/448
166737  10/1982  Japan ................................... 307/451

OTHER PUBLICATIONS

Delecki et al., "Skew Insensitive AND Circuit", IBM-TDB; vol. 17, No. 9, p. 2581; 2/1975.

Primary Examiner—Larry N. Anagnos
Attorney, Agent, or Firm—Finnegan, Henderson, Farabow, Garrett & Dunner

[57] ABSTRACT

A CMOS logic circuit has MOSFETs of a first conductivity type in which each terminal is connected to a corresponding input terminal of the CMOS logic circuit, delay elements are inserted between the input terminals of the CMOS logic circuit and the gates of the MOSFETs of the first conductivity type, an output inverter is inserted between the remaining terminals of each of the MOSFETs of the first conductivity type and the output terminal of the CMOS logic circuit, and in which a MOSFET of a second conductivity type is inserted between the input terminal of the output inverter and a power source which is controlled by the output from the output inverter.

7 Claims, 9 Drawing Figures

CMOS LOGIC CIRCUIT

BACKGROUND OF THE INVENTION

The present invention relates to a CMOS logic circuit which comprises CMOSFETs and, more particularly, to a high-speed arrangement of a multi-input logic circuit.

In a conventional CMOS logic circuit, a drive circuit comprises N-channel MOSFETs, and a load circuit comprises P-channel MOSFETs. The N- and P-channel MOSFETs are used in the drive and load circuits in a complementary manner. FIG. 1 is a circuit diagram of an N-input NAND gate in a typical CMOS logic circuit. The load circuit 11 comprises P-channel MOSFETs QP1, QP2, QP3 ... which are connected in parallel with each other, and the drive circuit 12 comprises N-channel MOSFETs QN1, QN2, QN3 ... which are connected in series with each other. The common node of one terminal of each of the MOSFETs QP1, QP2, QP3 ... is connected to a voltage source 13 for supplying an operating voltage Vcc. The common node of the other terminal of each of the MOSFETs QP1, QP2, QP3 ... is connected to one terminal of the MOSFET QN1 and to an output terminal 14. The other terminal of the MOSFET QN1 is connected to a ground through the MOSFETs QN2, QN3 ... The gates of the MOSFETs QP1 and QN1, QP2 and QN2, QP3 and QN3 ..., respectively, are commonly connected, and the common gate nodes are connected to input terminals 15a, 15b, 15c which receive input signals A, B, C ..., respectively.

The operation of the NAND gate described above will be described hereinafter. Assume that "L" level is defined as the ground potential, and that "H" level is defined as the operating potential Vcc. When the input signals A, B, C ... are all set at the "L" level, the MOSFETs QP1, QP2, QP3 ... are turned on, and the MOSFETs QN1, QN2, QN3 ... are turned off. Therefore, the output signal is set at the "H" level. When at least one of the input signals A, B, C ... is set at the "L" level, the corresponding MOSFET QP1, QP2, QP3 ... is turned on, and the gate of the N-channel MOSFET (in the drive circuit 12) which happens to be connected to the gate thereof is turned off. Therefore, the output signal is set at the "H" level. On the other hand, when the input signals A, B, C ... are all set at the "H" level, all the MOSFETs QP1, QP2, QP3 ... are turned off, and all the MOSFETs QN1, QN2, QN3 ... are turned on. Thus, the output signal is set at the "L" level. In this manner, a NAND output A·B·C ... of the input signals A, B, C ... appears at the output terminal 14.

However, when the multi-input logic circuit is constituted by a CMOS static circuit, and the number of input signals is increased, the delay time of the output increases in proportion to the power of the number N of the input signals. As a result, the operating speed is lowered, resulting in inconvenience. This is because when the N-channel MOSFETs are connected in series with each other in the drive circuit of the NAND gate, the output voltage is shunted as a drain-source voltage of each of the N-channel MOSFETs QN1, QN2, QN3 ..., the gate-source voltage of each of the MOSFETs drops, and hence the current flowing through the drive circuit decreases. In addition, when the number of series-connected MOSFETs is increased, the source voltages of the MOSFETs also increase due to the voltage drop, so that the source-substrate path is reversely biased. As a result, the effective threshold voltage of the MOSFET increases due to the back-gate effect, and the current flowing from the drain to the source of each MOSFET decreases, thereby decreasing the operating speed.

In order to solve the problems described above, the channel width of each of the MOSFETs QN1, QN2, QN3 ... in the drive circuit can be increased. However, when the channel width is increased, the channel pattern area is increased, thereby increasing the parasitic capacitance, the charge/discharge current, and hence power consumption.

In the arrangement wherein the drive circuit has MOSFETs connected in series with each other, the priority order of input signals must be considered, since the operating speed depends on the last input signal. When the input signals are sequentially supplied in a predetermined order, they must be supplied from the MOSFET QN1 connected to the output terminal 14 to the MOSFET connected to the ground terminal through QN2, QN3 ..., respectively.

SUMMARY OF THE INVENTION

It is, therefore, an object of the present invention to provide a CMOS logic circuit which can perform a high-speed operation without an increase in the signal delay time even if the number of input signals is increased, which can decrease a pattern area and power consumption, and which does not require that consideration be given to a priority order of input signals.

According to an aspect of the present invention, there is provided a CMOS logic circuit comprising: a voltage source; a plurality of input terminals of the CMOS logic circuit; MOSFETs of a first conductivity type, each of which has one terminal connected to a corresponding one of the input terminals of the CMOS logic circuit, the other terminal connected to a common node, and a gate; delay elements connected between the input terminals of the CMOS logic circuit and the gates of the MOSFETs of the first conductivity type, respectively; an output inverter having an input terminal connected to the common node and having an output terminal; an output terminal of the CMOS logic circuit which is connected to the output terminal of the output inverter; and a MOSFET of a second conductivity type which has one terminal connected to the input terminal of the output inverter, the other terminal connected to the voltage source, and a gate connected to the output terminal of the output inverter.

DETAILED DESCRIPTION OF THE PREFERRED EMBODIMENTS

Figure 2:
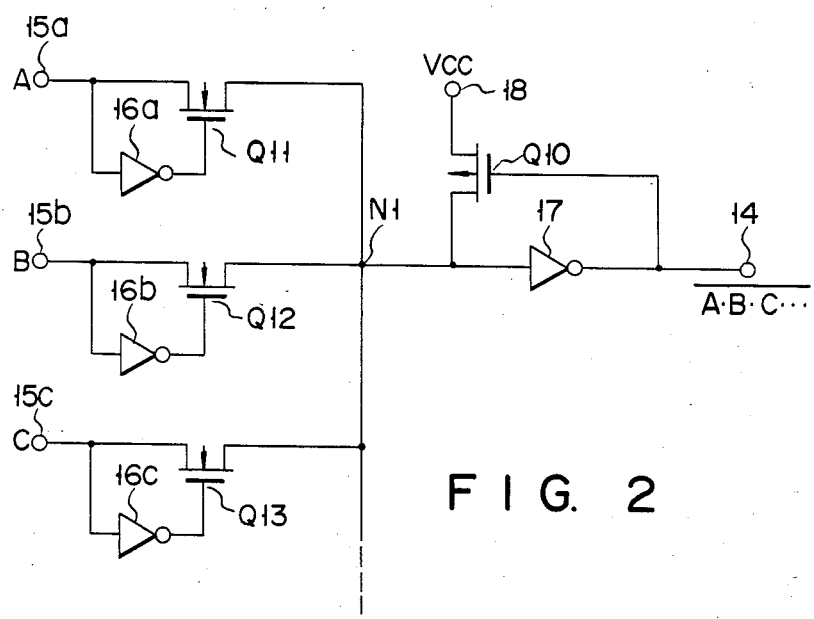
FIG. 2 is a circuit diagram of a CMOS logic circuit according to an embodiment of the present invention.
Figure 3:
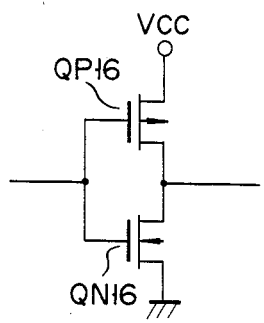
FIG. 3 is a circuit diagram for explaining an inverter arrangement of the circuit shown in FIG. 2.

FIG. 2 shows a CMOS logic circuit according to an embodiment of the present invention. Input signals A, B, C . . . are supplied to input terminals 15a, 15b, 15c . . . , respectively. One terminal of each of MOSFETs Q11, Q12, Q13 . . . of a first conductivity type (N-channel) is connected to its corresponding input terminal 15a, 15b, 15c . . . Inverters 16a, 16b, 16c . . . which serve as a delaying means are inserted between the input terminals 15a, 15b, 15c . . . and the gates of the MOSFETs Q11, Q12, Q13 . . . , respectively. The other terminal of each of the MOSFETs Q11, Q12, Q13 . . . is connected to a common node N1. The input terminal of an output inverter 17 is connected to the node N1. An output terminal 14 of the CMOS logic circuit is connected to the output terminal of the output inverter 17. A feedback MOSFET Q10 of a second conductivity type (P-channel) is inserted between the input terminal of the inverter 17 and a voltage source 18 for supplying an operating potential Vcc. The gate of the MOSFET Q10 is connected to the output terminal of the inverter 17. The back-gate terminals of the MOSFETs Q11, Q12, Q13 . . . are connected to a ground. The back-gate terminal of the MOSFET Q10 is connected to the voltage source 18. Each of the inverters 16a, 16b, 16c . . . comprises a CMOS inverter which has a P-channel MOSFET QP16 and an N-channel MOSFET QN16, as shown in FIG. 3. The transconductance gm of the MOSFET QN16 is smaller than that of the MOSFET QP16. Therefore, the delay time in switching from the "H" level to the "L" level of each of the inverters 16a, 16b, 16c . . . is set to be shorter than the delay time in switching from the "L" level to the "H" level of the corresponding input signal A, B, C . . .

The operation of the CMOS logic circuit having the arrangement described above will now be described. For illustrative convenience, a two-input logic circuit is exemplified, so that the input signals A and B alone are used. When the input signal A is set at the "H" level (Vcc potential) and the input signal B is set at the "L" level (ground potential), the N-channel MOSFET Q11 is turned off, and the MOSFET Q12 is turned on. When the drive capacity of the MOSFET Q12 is sufficiently greater than that of the MOSFET Q10, the common node N1 at the input side of the inverter 17 is connected to the input terminal 15b through the MOSFET Q12, and is set at the the "L" level. The output from the input terminal 17 is set at the "H" level, and the MOSFET Q10 is turned off. Therefore, the output signal appearing at the output terminal 14 goes to the "H" level at high speed. When the input signal B goes from the "L" level to the "H" level, the potential at the node N1 increases since a current flows from the input terminal 15b due to the "H" level of the input signal B within a predetermined time interval in which the MOSFET Q12 changes from the ON state to the OFF state by means of the inverter 16b. When the potential at the node N1 exceeds an inverted voltage at the output inverter 17, the output from the inverter 17 is set at the "L" level. The MOSFET Q10 is then turned on, and the potential at the node N1 increases to the "H" (Vcc) level at a high speed. Therefore, the potential at the output terminal 14 is stabilized at the "L" level. When the input signals A and B are both set at the "L" level, the MOSFETs Q11 and Q12 are turned on, the potential at the node N1 is set at the "L" level, and an output from the inverter 17 is set at the "H" level. The "H" level signal from the inverter 17 disables the MOSFET Q10.

A NAND output A·B in response to the two inputs appears at the output terminal 14. The same result as described above can be obtained from any other multi-input logic circuit. The number of series-connected MOSFETs is not increased so that a high-speed operation can be performed without an increase in channel width of the series connected MOSFETs. In addition, as the input signals A, B, C . . . are supplied in parallel, the priority order of input signals can be omitted from the circuit design.

Figure 4:
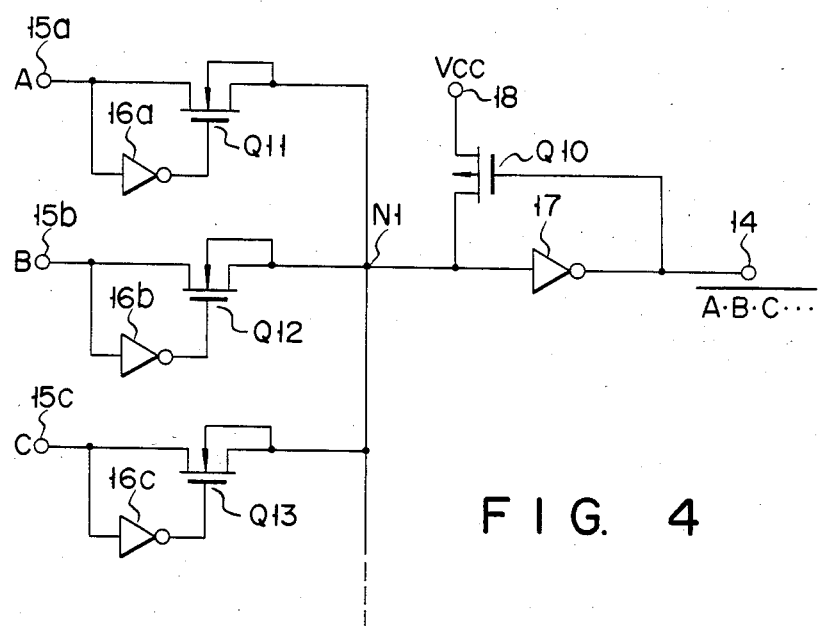
FIGS. 4 to 8 are circuit diagrams of CMOS logic circuits according to other embodiments of the present invention, respectively.

FIG. 4 shows another embodiment of the present invention. A CMOS logic circuit of this embodiment is substantially the same as that of FIG. 2, except that the back-gate terminals of MOSFETs Q11, Q12, Q13 . . . are connected to a node N1, as compared to the case in FIG. 2 wherein the back-gate terminals of the MOSFETs Q11, Q12, Q13 . . . were grounded. The same reference numerals as used in FIG. 4 denote the same parts in FIG. 2, and a detailed description thereof will be omitted.

According to the arrangement in FIG. 4, the MOSFETs Q11, Q12, Q13 . . . operate as reverse biased diodes when the input signals A, B, C . . . change from the "L" level to the "H" level. However, the MOSFETs Q11, Q12, Q13 . . . operate as forward biased diodes when the input signals A, B, C . . . change from the "H" level to the "L" level. Therefore, a high-speed operation can be performed when the input signals A, B, C . . . change from the "H" level to the "L" level.

Figure 5:
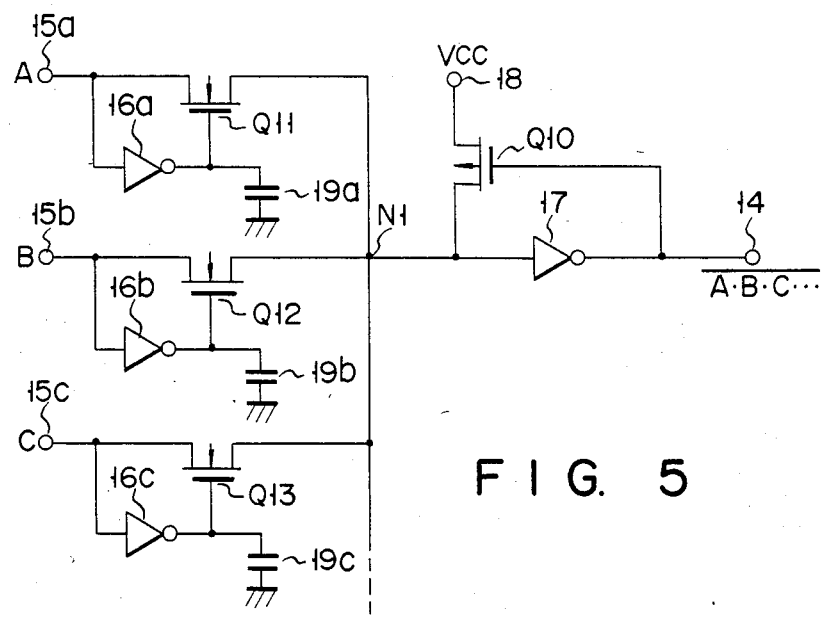

FIG. 5 shows still another embodiment of the present invention. In the previous embodiments, the inverters 16a, 16b, 16c . . . were used as the delaying means. However, in the embodiment shown in FIG. 5, capacitors 19a, 19b, 19c . . . are inserted between the output terminals of the inverters 16a, 16b, 16c . . . and the ground, respectively. The capacitors 19a, 19b, 19c . . . serve to control the delay time. The delay time of the input signals can be freely controlled in accordance with the different capacitances of the capacitors 19a, 19b, 19c . .

Figure 6:
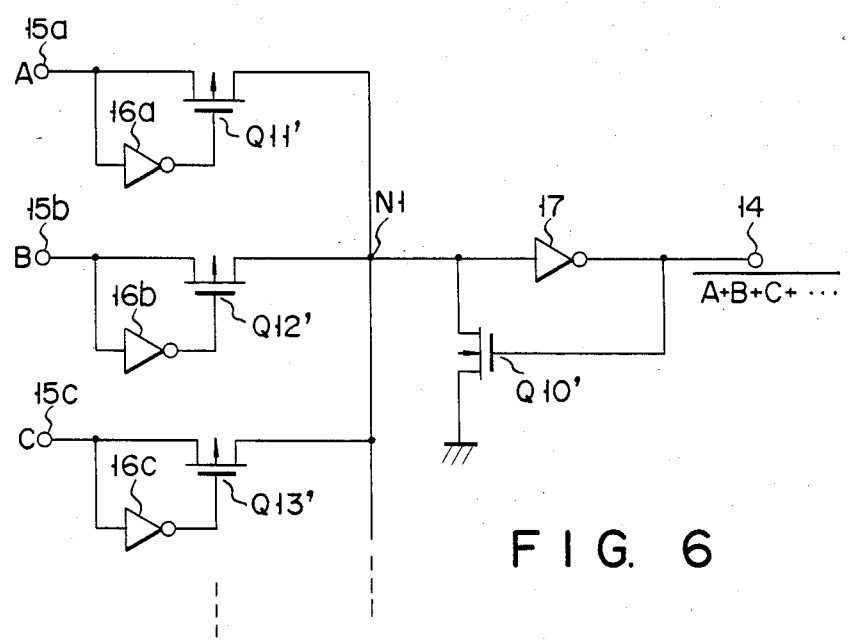

In the embodiments shown in FIGS. 2, 4 and 5, the MOSFETs Q11, Q12, Q13 . . . of the first conductivity type comprise N-channel MOSFETs; and the feedback MOSFET Q10 of the second conductivity type comprises a P-channel MOSFET. However, a still further embodiment is shown in FIG. 6 wherein each reference numeral is suffixed with a prime ('), and which comprises P-channel MOSFETs Q11', Q12', Q13' . . . and an N-channel MOSFET Q10'. In this case, one terminal of the MOSFET Q10' is grounded instead of being connected to the operating voltage Vcc. It should be noted that the voltage source correspond to the ground potential level. The back-gate terminals of the MOSFETs Q11', Q12', Q13'. . . are connected to the operating voltage source, and the back-gate terminal of the MOSFET Q10' is connected to the voltage source (ground). This circuit is operated in the same manner as the circuit shown in FIG. 2, except that the polarities of the MOSFETs are reversed. As a result, a NOR output A+B+C+ . . . appears at the output terminal 14 of the circuit shown in FIG. 6. Each of the inverters 16a, 16b, 16c . . . shown in FIG. 6 comprises a P-channel MOSFET QP16 and an N-channel MOSFET QN16 in the same manner as shown in FIG. 3. The drive MOSFET QN16 has a larger transconductance gm than that of the load MOSFET QP16. Therefore, the delay time in switching from the "L" level to the "H" level of the inverters 16a, 16b, 16c . . . is set to be shorter than the delay time in switching from the "H" level to the "L" level of the input signals A, B, C . . .

The operation of the circuit shown in FIG. 6 will be exemplified using a two-input logic circuit, wherein the input signals A and B alone are used. When the input signal A is set at the "H" level (Vcc potential) and the input signal B is set at the "L" level (ground potential), the MOSFET Q11' is turned on, and the MOSFET Q12' is turned off. When the drive capacity of the MOSFET Q11' is sufficiently larger than that of the MOSFET Q10', a node N1 goes to the "H" level in response to the "H" level of the input signal A through the MOSFET Q11'. Therefore, the output from the inverter 17 is set at the "L" level, and the MOSFET Q10' is turned off. The above operation can also be performed when the levels of the input signals A and B are inverted. When the input signal A changes from the "H" level to the "L" level, the potential at the node N1 decreases since current flows out of the input terminal 15a due to the input signal A of "L" level within a predetermined time interval in which the MOSFET Q11' changes from the ON state to the OFF state due to the delay produced by the inverter 16a. When the potential at the node N1 becomes lower than the invert voltage at the output inverter 17, the output from the inverter 17 goes to the "H" level. The MOSFET Q10' is turned on, so that the potential at the node N1 is set at the "L" level, and the potential at the output terminal 14 is stabilized at the "H" level. When the input signals A and B are both set at the "H" level, the MOSFETs Q11' and Q12' are turned on, so that the potential at the node N1 is set at the "H" level, and the output from the inverter 17 is set at the "L" level. The "L" level signal from the inverter 17 disables the MOSFET Q10'.

A NOR output A+B appears at the output terminal 14 in response to the two inputs. This operation can also be performed by another multi-input logic circuit. The number of series-connected MOSFETs is not increased, so that a high-speed operation can be performed without increasing the channel width of the series connected MOSFETs. In addition, as the input signals A, B, C . . . are supplied in parallel, the priority order of the input signals can be omitted from the circuit design.

Figure 7:
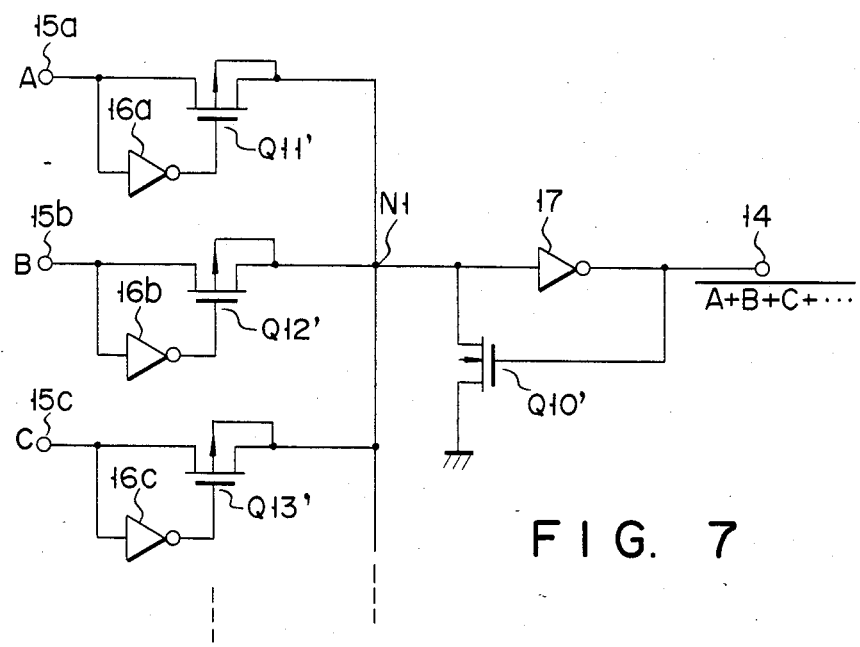

FIG. 7 shows still another embodiment of the present invention. Unlike the embodiment shown in FIG. 6 wherein the back-gate terminals of the MOSFETs Q11', Q12', Q13' . . . are connected to the operating voltage source for supplying the operating potential Vcc, the embodiment shown in FIG. 7 has an arrangement such that back-gate terminals of MOSFETs Q11', Q12', Q13'. . . are connected to a node N1.

According to the arrangement shown in FIG. 7, the MOSFETs Q11', Q12', Q13'. . . operate as forward biased diodes when the respective input signals A, B, C . . . change from the "L" level to the "H" level. However, the MOSFETs Q11', Q12', Q13'. . . operate as riverse biased diodes when the respective input signals A, B, C . . . change from the "H" level to the "L" level. Therefore, a high-speed operation can be performed when the input signals A, B, C . . . change from the "L" level to the "H" level.

Figure 8:
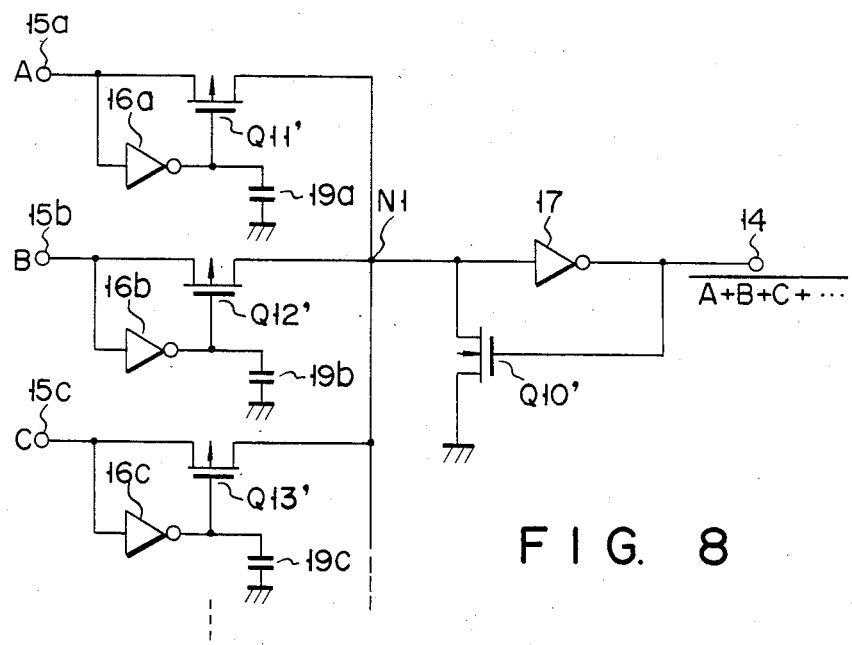

FIG. 8 shows still another embodiment of the present invention. Unlike the embodiments shown in FIGS. 6 and 7 wherein the inverters 16a, 16b, 16c . . . are arranged as the delaying means, additional capacitors 19a, 19b, 19c . . . are inserted between the output terminals of the inverters 16a, 16b, 16c . . . and the ground, respectively, in the same manner as in FIG. 5. This arrangement allows the delay time of the input signal to be controlled in the same manner as in FIG. 5.

Figure 1:
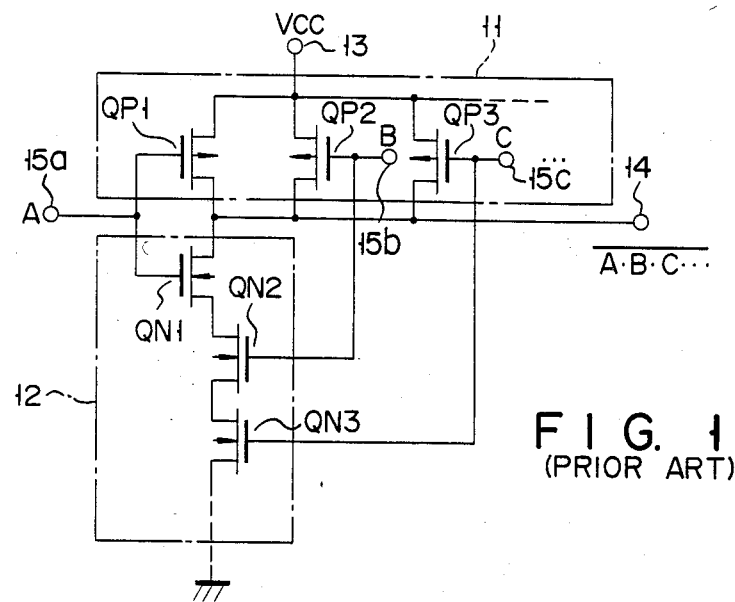
FIG. 1 is a circuit diagram of a conventional CMOS logic circuit.
Figure 9:
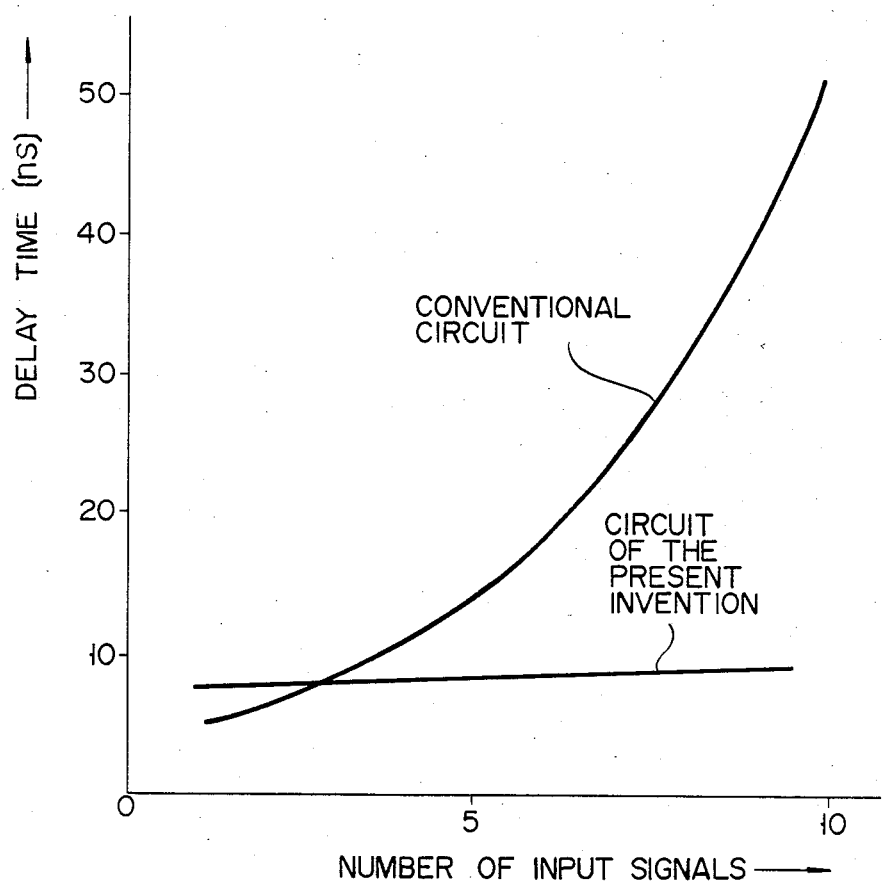
FIG. 9 is a graph for explaining the relationship between the delay time and the number of input signals in both the conventional CMOS logic circuit and the CMOS logic circuit shown in FIG. 2.

FIG. 9 shows the delay time of the output signals from the CMOS logic circuit (FIG. 2) of the present invention and the conventional CMOS logic circuit (FIG. 1), as a function of the number of input signals to these CMOS logic circuits. In the conventional circuit, when the number of input signals is increased, the delay time greatly increases. However, in the circuit of the present invention, the delay time shows substantially no increase even though the number of input signals is increased. According to the present invention, the delay time does not depend on the number of input signals. When the number of input signals is small, the delay time of the conventional circuit is smaller than that of the present invention. However, when the number of input signals is increased, the delay time of the conventional circuit remarkably increases and becomes much greater than that of the circuit of the present invention. This is because the delay operation according to the present invention is performed by inverters. The delay time effected by the inverters is not prolonged, even if the number of input signals is increased. Therefore, the present invention is advantageous in a multi-input logic circuit. When the present invention is applied to a multi-input logic circuit, a high-speed operation can be effectively performed. In addition, the pattern area of the driver MOSFET need not be increased, thereby decreasing the parasitic capacitance, the charge/discharge current, and hence, power consumption.

What is claimed is:

1. A CMOS logic circuit comprising:
   a voltage source;
   a plurality of input terminals of said CMOS logic circuit;
   MOSFETs of a first conductivity type, each of which has one terminal connected to a corresponding one of said input terminals of said CMOS logic circuit, the other terminal connected to a common node, and a gate;
   delaying means inserted between said input terminals of said CMOS logic circuit and the respective gates of said MOSFETs of the first conductivity type, respectively;
   an output inverter having an input terminal connected to said common node of said MOSFETs of the first conductivity type, and an output terminal;
   an output terminal of said CMOS logic circuit which is connected to said output terminal of said output inverter; and
   a MOSFET of a second conductivity type which has one end connected to said input terminal of said output inverter, the other end connected to said voltage source, and a gate connected to said output terminal of said output inverter.

2. A circuit according to claim 1, wherein said delaying means comprises inverters, input terminals which are respectively connected to said input terminals of said CMOS logic circuit, and output terminals which are connected to said gates of said MOSFETs of the first conductivity type.

3. A circuit according to claim 1, wherein said delaying means comprises inverters, the input terminals of which are respectively connected to said input terminals of said CMOS logic circuit, the output terminals of which are connected to said gates of said MOSFETs of the first conductivity type, and capacitors respectively inserted between said output terminals of said inverters and ground potential.

4. A circuit according to claim 1, wherein said MOSFETs of the first conductivity type comprise N-channel MOSFETs, said MOSFET of the second conductivity type comprises a P-type MOSFET, said voltage source supplies an operating potential.

5. A circuit according to claim 4, wherein each back-gate of said MOSFETs of the first conductivity type is connected to the other terminal of a corresponding one thereof.

6. A circuit according to claim 1, wherein said MOSFETs of the first conductivity type comprise P-channel MOSFETs, said MOSFET of the second conductivity type comprises an N-type MOSFET, said voltage source supplies a ground potential.

7. A circuit according to claim 6, wherein each back-gate of said MOSFETs of the first conductivity type is connected to the other terminal of a corresponding one thereof.

* * * * *